United States Patent [19]
Hashimoto

[11] Patent Number: 6,144,507
[45] Date of Patent: Nov. 7, 2000

[54] METHOD OF MOUNTING A SEALED ASSEMBLY ON A MOUNTING SUBSTRATE AND OPTICAL TRANSDUCER

[75] Inventor: Nobuaki Hashimoto, Suwa, Japan

[73] Assignee: Seiko Epson Corporation, Tokyo, Japan

[21] Appl. No.: 09/214,677

[22] PCT Filed: Jul. 3, 1997

[86] PCT No.: PCT/JP97/02304

§ 371 Date: Mar. 18, 1999

§ 102(e) Date: Mar. 18, 1999

[87] PCT Pub. No.: WO98/03990

PCT Pub. Date: Jan. 29, 1998

[51] Int. Cl.[7] .................................................. G02B 7/02
[52] U.S. Cl. .............................. 359/819; 313/35; 257/680
[58] Field of Search ........................... 359/819; 313/500, 313/35, 36; 257/680, 684, 723

[56] References Cited

U.S. PATENT DOCUMENTS

| | | | |
|---|---|---|---|
| 4,760,440 | 7/1988 | Bigler et al. | 357/74 |
| 5,134,340 | 7/1992 | Haitz | 313/500 |
| 5,847,650 | 12/1998 | Zhou et al. | 340/572 |

FOREIGN PATENT DOCUMENTS

| | | |
|---|---|---|
| 49-88665 | 11/1947 | Japan. |
| 48-57580 | 8/1973 | Japan. |
| 6-283569 | 10/1994 | Japan. |

*Primary Examiner*—Georgia Epps
*Assistant Examiner*—Timothy Thompson
*Attorney, Agent, or Firm*—Oliff & Berridge, PLC.

[57] ABSTRACT

A new mounting technology allows an optical transducer or semiconductor device to be mounted on a printed wiring board at high density, simply, and at low cost. When a sealed assembly is mounted on a printed wiring board (400), an opening portion (340) is provided in a portion of the printed wiring board. Conductive junction portions (360*b* and 360*c*) are provided on the surface of a base member (100). Then, the mounting is carried out by face-down bonding. The opening portion is provided in the printed wiring board, so that at least a portion of a sealing member of the sealed assembly is inserted in the opening portion. Such a structure makes face-down bonding possible, since the thickness of the sealing member of the sealed assembly and the thickness of the printed wiring board are adjusted by inserting the sealed assembly into the printed wiring board.

20 Claims, 13 Drawing Sheets

LIGHT

METHOD OF MOUNTING A SEALED ASSEMBLY ON A MOUNTING SUBSTRATE AND OPTICAL TRANSDUCER

TECHNICAL FIELD

The present invention relates to a method of mounting a sealed assembly on a mounting substrate and an optical transducer.

BACKGROUND ART

Mounting arrangements in which an element or the like is mounted directly on a substrate are known generically as COX (where X is B, G, or the like).

Of these, COG (Chip On Glass) is, as shown in FIG. 13, a form of mounting in which an element is mounted on a glass substrate by, for example, face-down bonding.

A liquid crystal display device shown in FIG. 13 has a glass substrate (base member) 3000, an opposing substrate (sealing member) 3100 and a sealing material 3200, in which a liquid crystal material is sealed. Elements including drive ICs 3300 and 3400 are mounted on the glass substrate 3000.

FIG. 14 shows another example of a COG mounting. In FIG. 14, a CCD (Charge Coupled Device) chip 3600 is face-down bonded on a transparent glass substrate 3010 with bumps 3700 interposed. An IC chip 3310 is also face-down bonded on the glass substrate 3010 with bumps 3710 interposed therebetween. It should be noted that in FIG. 14, reference numerals 3800, 3810, and 3820 indicate wiring layers.

It is essential for the liquid crystal display device shown in FIG. 13 to construct the base member with the glass substrate 3000, since it is required to transmit light. The optical transducer, as in the CCD chip 3600 shown in FIG. 14, has a light receiving surface (or light emitting surface) positioned on the same surface as the bumps. For this reason, a transparent substrate such as the glass substrate 3010 shown in FIG. 14 must be used.

It is, however, difficult to form a layered conductor construction on the glass substrate, thus there are limits to high-density mounting.

The present invention is made in the light of such problems. The object of the present invention is the provision of a new mounting technology such that a sealed assembly in which an optical transducer to be required to allow light to pass or a liquid crystal or the like is sealed can be mounted on a mounting substrate at high density, both easily and at low cost.

SUMMARY OF THE INVENTION

The method of mounting a sealed assembly on a mounting substrate of the present invention is a method of mounting a sealed assembly, being of projecting form and having a sealing member fixed to a portion of a base member in such a way as to project from the base member, on a mounting substrate, comprising:

a step of providing an opening portion in a portion of the mounting substrate, and providing a conductive junction portion on a surface of the base member outside of the sealing member; and with at least a part of the sealing member positioned within the opening portion of the mounting substrate, a step of connecting the conductive junction portion to a wire on the mounting substrate.

In the present invention, the sealed assembly is mounted on the mounting substrate by face-down bonding, using a conductive junction portion such as a conductive projection (bump).

In this case, the sealed assembly has a certain thickness (at least the sum thickness of the base member and sealing member). In particular, when it is seen from the base member, the sealed assembly projects by the thickness of the sealing member. Attempting to carry out face-down bonding with such a sealed assembly means that the conductive junction portion formed on the base member (for example bump electrodes) does not reach the mounting substrate, thus interfering with face-down bonding (face-down bonding may in some cases not be possible).

Here a certain opening portion is provided in the mounting substrate, at least a portion of a sealing member of the sealed assembly is inserted in the opening portion, and the thickness of the sealing member of the sealed assembly clears the printed wiring board in the thickness direction. Thus, face-down bonding is made possible.

By adoption of this mounting technique, since the airtight sealed assembly can be joined to the mounting substrate not by individual connections such as wiring connection, but in a single connection operation, this is extremely beneficial particularly in the case of a large number of junctions. Since wire connections are not required, the mounting space can be reduced and the operation simplified, and furthermore cost reductions can be achieved.

In the present invention, at least a portion of the sealing member may be formed of a material allowing light to pass. By means of this, the sealed assembly can be constituted as an optical transducer.

It should be noted that "optical transducer" refers to something in which processing accompanies the impinging of light or the emission of light, for example, there are display devices using a photoreceptor such as a photodiode, a photoemitter such as a semiconductor laser, or a light modulating element such as a liquid crystal or reflecting mirror device. In other words, a "photoreceptor" has the function of receiving light and converting it into an electric signal (voltage or current), a "photoemitter" has the function of converting an electric signal (voltage or current) into light. A display device such as a liquid crystal has the function of controlling the transmission or reflection of light according to an electric signal (voltage or current), to vary a display output (in other words, a light output). In this way, within this specification the term "optical transducer" is used to refer to a "device having a function in which processing accompanies the impinging of light or the emission of light."

According to this mounting technique, the light irradiation area or effective display area is increased, while allowing the efficient mounting of a sealed assembly having an optical processing function on a mounting substrate.

In the present invention, an IC used with respect to the sealed assembly may be mounted on the mounting substrate by direct connection of a conductive junction portion to a wire of the mounting substrate.

The IC may be mounted simultaneously with the sealed assembly, and further, peripheral ICs (ICs used with respect to the sealed assembly) may be mounted on the mounting substrate by the same connection method (for example, using bumps).

By using this mounting technology, the ICs may be simultaneously mounted, and the operation of mounting on the mounting substrate made more efficient.

The optical transducer of the present invention comprises:

an optical modulation component having an optical conversion function, the optical modulation component mounted with an active surface facing a mounting surface of the mounting substrate; and a mounting substrate on which the optical modulation component is mounted, the mounting substrate having an opening portion in an area facing a whole active region performing optical conversion of the active surface of the optical modulation component.

As described above, in a method of mounting a transparent glass substrate such as is shown in FIG. 14, it is difficult to form a layered construction of a glass substrate, and therefore there are limits to high density mounting. Therefore, in the present invention, an optical modulation component is mounted on a "mounting substrate" which is possible to adopt a layered construction of conducting layers. By the adoption of a layered construction of conducting layers, high density mounting is enabled.

However, since a mounting substrate such as a printed wiring board or ceramic substrate is opaque, when an optical modulation component is mounted by face-down bonding, impinging of light on the active surface of the optical modulation component, or emission of light from the active surface is not possible. In answer to this, an opening portion is provided at a certain location in the mounting substrate, and impinging of light on the active surface of the optical modulation component, or emission of light from the active surface is possible through this opening portion.

In the present invention, the optical modulation component may be a sealed assembly;

the sealed assembly may have an airtight sealing construction by virtue of a sealing member being fixed to a portion of a base member, and a conductive junction portion being provided on a surface of the base member outside of the sealing member; and with at least a part of the sealing member positioned within the opening portion of the mounting substrate, the conductive junction portion may be connected to a wire on the mounting substrate.

This is an optical transducer fabricated using the above described mounting technique. In particular, since at least a portion of the thickness projecting from the base member can be absorbed by the mounting substrate, a compact optical transducer is obtained.

In the present invention, a gap between the optical modulation component and an inner wall of the opening portion of the mounting substrate may be filled with resin.

In order to prevent light leaking from the gap around the opening portion of the mounting substrate, it is filled with resin.

During filling with the resin, the sealing member and inner wall of the opening portion of the mounting substrate serve as a dam to prevent spreading of the resin, and therefore adjustment of the inserting amount of resin and positioning during filling is easy.

In the present invention, on a surface of the mounting substrate where the optical modulation component is mounted, an IC used with respect to the optical modulation component may be connected through a conductive junction portion.

Moreover, on a surface of the mounting substrate below the IC, an opaque layer may be provided. This opaque layer may be of the same material as the wiring layer of the mounting substrate.

The optical modulation component is face-down bonded, and therefore, light impinges from the opening portion of the mounting substrate or is irradiated downward. In this case, when stray light is generated it will exert an undesirable influence on the operation of the IC. In other words, if light passes through the mounting substrate and reaches the IC, or is transmitted through a gap in the opening portion to the IC, then the operation of the IC will be undesirably influenced.

Here, using the wiring material of the mounting substrate or the like, an opaque layer is formed on the surface of the mounting substrate below the IC, to block light.

On a surface of the mounting substrate opposite to a surface on which the IC is mounted may be formed an opaque layer overlapping with at least a portion of the IC.

By providing an opaque layer on the reverse surface of the mounting substrate, the property of shutting out light is improved in the mounting substrate. As a result, IC malfunctions can be effectively prevented.

By providing the opaque layer on the surface layer (outermost layer) of the reverse surface of the mounting substrate, the opaque layer can be provided afterwards (post-provided). In other words, the existing substrate fabrication process can be used without alteration, and simply by adding a step of providing the opaque layer. Therefore, a selection not to provide an opaque layer can be carried out easily so that range of selection is broadened. Further, since the surface on which the opaque layer is provided is the surface opposing the surface on which the ICs are mounted, the opaque layer may simply be provided over the whole of a desired region, and can be provided easily, without considering the positions of the wires or IC junctions.

In the case of this construction, a double-sided substrate (a substrate formed with wiring layers formed on both surfaces of a core layer (insulating layer)) may be used. In other words, a multilayer substrate (a substrate built up from alternate layers of wiring metal layers and insulating layers) does not have to be used, which is favorable from the point of view of cost.

In the present invention inside of the mounting substrate below the IC, an opaque layer may be provided, This opaque layer may be of the same material as the wiring layer of the mounting substrate. The opaque layer is formed embedded within the mounting substrate.

A heat radiating plate may be adhered to a surface of the IC opposite to a surface on which the junction portion is formed. By this means, heat from the IC can be efficiently released.

A heat radiating plate may be adhered to the optical modulation component. By this means, cooling of the optical modulation component can be achieved.

Alternatively, a heat radiating plate may be adhered to a surface of the IC opposite to a surface on which the junction portion is formed and to the optical modulation component. At this time, since the heat radiating plate can have a large area, the heat releasing efficiency can be increased while remaining thin.

Further, the heat radiating plate may be fixed to the mounting substrate. By this means, the mounting substrate and heat radiating plate are formed as one unit, and the overall strength is improved.

A surface of the optical modulation component other than a mounting surface for the mounting substrate, and a wire on the mounting substrate may be electrically connected.

In this case, it is preferable that the heat radiating plate is adhered so as to be electrically conducting to the surface of the optical modulation component opposite to the mounting surface to the mounting substrate, and is electrically connected to a wire on the mounting substrate.

According to this, the potentials of the reverse surface of the optical modulation component and the wire on the mounting substrate can be the same. Therefore, for example, when the ground potential of the wire and the reverse surface of the optical modulation component are connected, electrified charge can escape to the reverse surface of the optical modulation component. Here, as a means for connecting the reverse surface of the optical modulation component and the wire on the mounting substrate the heat radiating plate is used so that there is no necessity to increase the number of components.

PREFERRED EMBODIMENTS OF THE INVENTION

Embodiments of the present invention are now described with reference to the drawings.

First Embodiment

Figure 1:
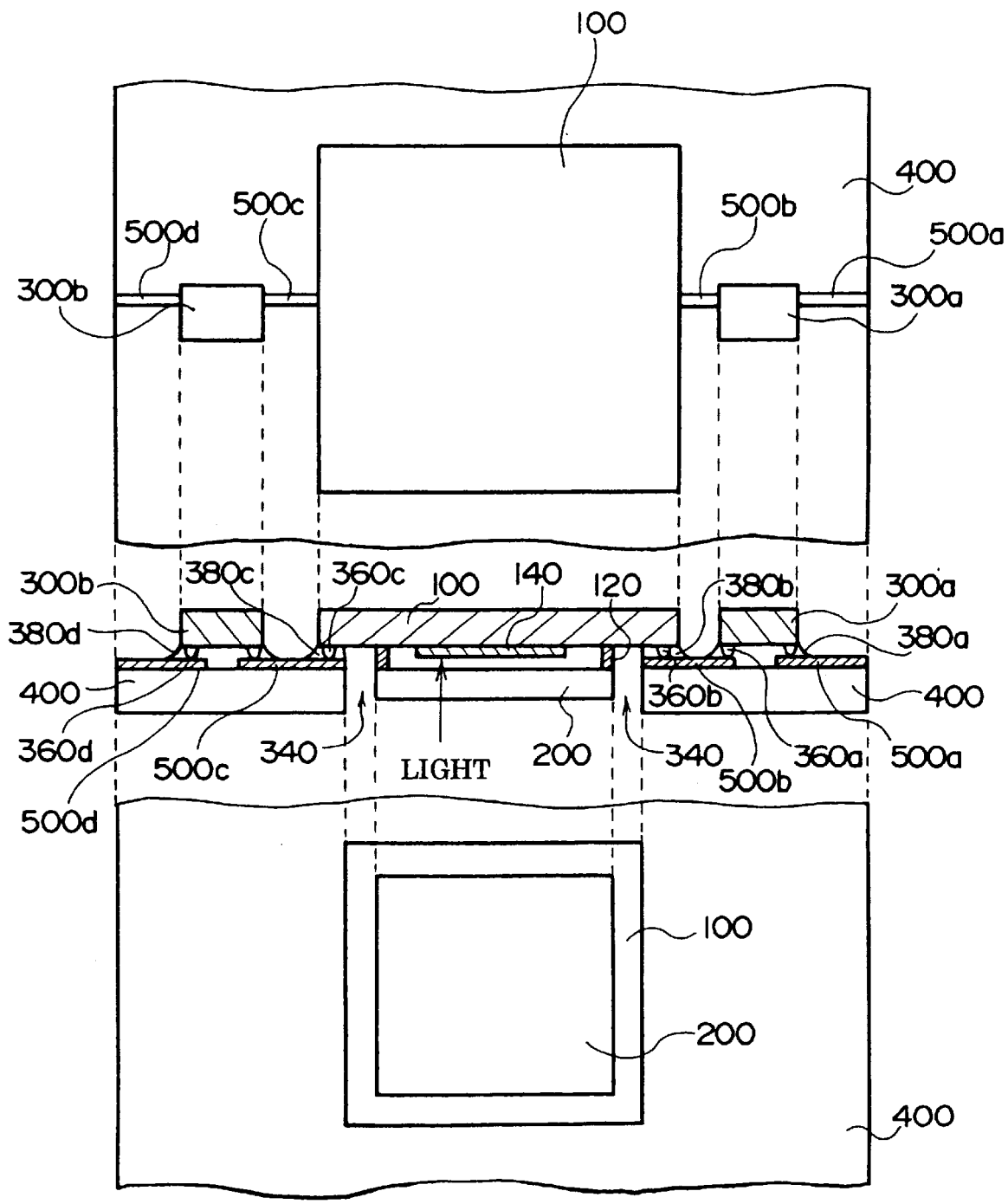
FIG. 1 shows a first embodiment of the present invention, with a plan view seen from above at the top, a plan view seen from below at the bottom, and a sectional structural view in the middle.

FIG. 1 shows a first embodiment of the present invention, with a plan view seen from above at the top, a plan view seen from below at the bottom, and a sectional structural view in the middle.

An element 140 having an optical processing function (optical modulation element: for example, a CCD) is mounted on a base member (substrate) 100, being enclosed by a sealing material 120 and sealing member (opposing substrate) 200 and sealed (hermetically sealed). In other words, a sealed assembly is constituted with an optical conversion function.

The sealing member (opposing substrate) 200 is formed of a material which allows light to pass, such as glass or transparent plastic or the like, and light passes through the sealing member (opposing substrate) 200 to impinge on a photoreceptor element 140.

Around the periphery of the base member (substrate) 100 are formed conductive junction portions (hereinbelow projections (bumps) being shown as an example) 360b and 360c.

In the center of a printed wiring board 400, an opening portion 340 is formed. It should be noted that, in the present embodiment, a printed wiring board is used as the mounting substrate, but the invention is not limited to this, and any mounting substrate may be used. For example, a ceramic substrate can also be used. This applies equally to other embodiments.

The sealed assembly having a light conversion function is face-down bonded, with the sealing member 200 to be inserted in the opening portion 340. In other words, the conductive projections (bumps) 360b and 360c are connected respectively to wires 500b and 500c on the printed wiring board.

ICs (semiconductor devices) 300a and 300b, similarly using conductive projections (bumps) 360a and 360d, are connected to wires 500a, 500b, 500c, and 500d on the printed wiring board 400 by the face-down method.

The projections (bumps) 360b and 360c of the sealed assembly, and the projections (bumps) 360a and 360d of the ICs 300a and 300b may be connected by exactly the same method, or connected in a different manner even in the same face down method. As for connection sequence, these may be simultaneous or not simultaneous.

It should be noted that in FIG. 1, reference numerals 380a, 380b, 380c, and 380d indicate coating layers of resin or the like.

In FIG. 1, typical wires 500a to 500b are only shown as the wires connected to ICs 300a and 300b. Moreover, in FIG. 1, ICs 300a and 300b are mounted only on the sides of the base substrate 100 in two directions, but the present invention is not limited to this, and the ICs may be mounted anywhere on the periphery of the base substrate 100.

As will be clear from FIG. 1, the thickness of the sealed assembly having an optical conversion function is absorbed by the opening portion 340 of the printed wiring board, and the height of the printed wiring board 400 is substantially the same as the height of ICs 300a and 300b. Therefore, the sealed assembly can be easily mounted on the printed wiring board using conductive projections (bumps), at the same time as the IC. Specifically, if the height can be maintained at about that of the ICs, the mounting procedure (sequence of element mounting) is not a concern. In other words, since particular tools are used for mounting, if the heights of elements are different, the procedure must inevitably start from the lower elements, whereas if all elements are of the same height, there are no such restrictions on mounting. Thus, the flexibility of element mounting is improved.

Mounting may be carried out, for example, by positioning the sealed assembly and ICs 300a and 300b in particular positions, then applying heat to connect the bumps to the wires on the printed wiring board.

Figure 2A:
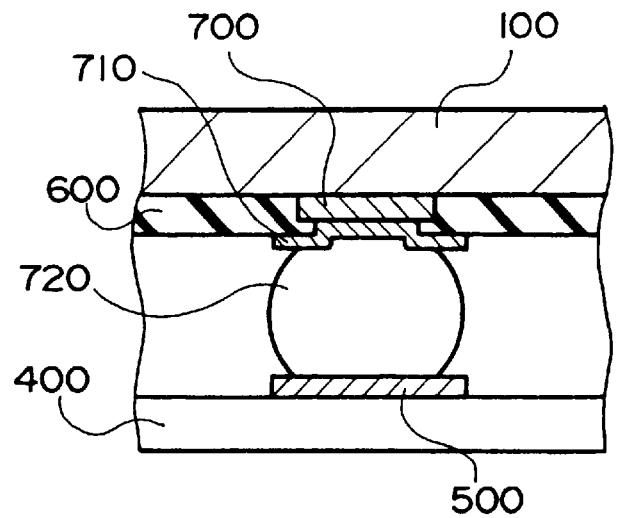
FIGS. 2A to 2C show examples of the construction of a conductive junction portion (for example, a conductive projection)
Figure 2B:
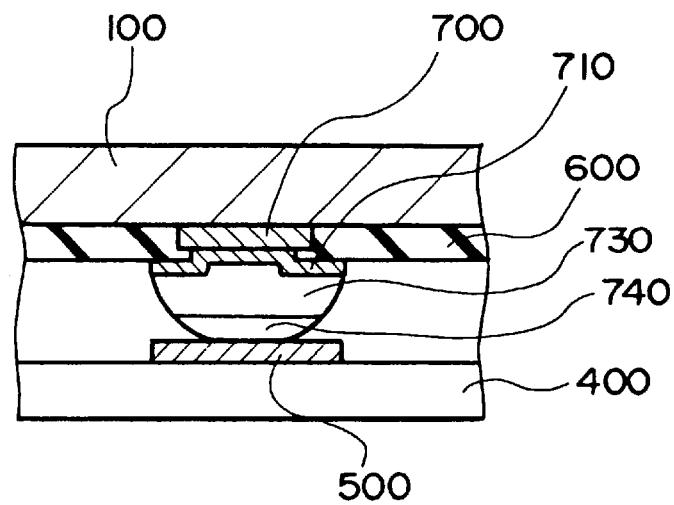
Figure 2C:
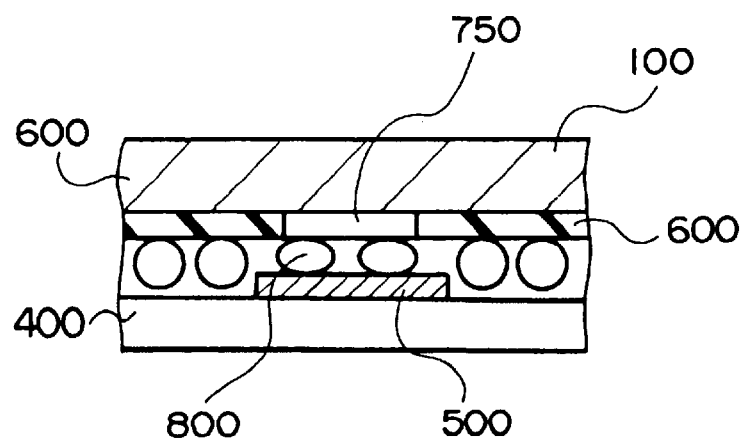

As the construction of the conductive projections (conductive junction portions), for example, as shown in FIGS. 2A to 2C, may be considered various possibilities.

FIG. 2A has a solder bump 720 formed on metal electrodes (aluminum electrodes or the like) 700 and 710 provided on the sealing member 100, and this solder bump 720 is connected to a wire 500 on the printed wiring board 400.

In FIG. 2B, a gold (Au) bump 730 is constructed with an alloy portion 740 of indium or the like provided at its extremity.

FIG. 2C shows a bump construction using an anisotropic conducting film. In other words, the connection to the wire 500 on the printed circuit board is through conductive balls 800 provided on the electrode 750 on the sealing member.

Figure 3:
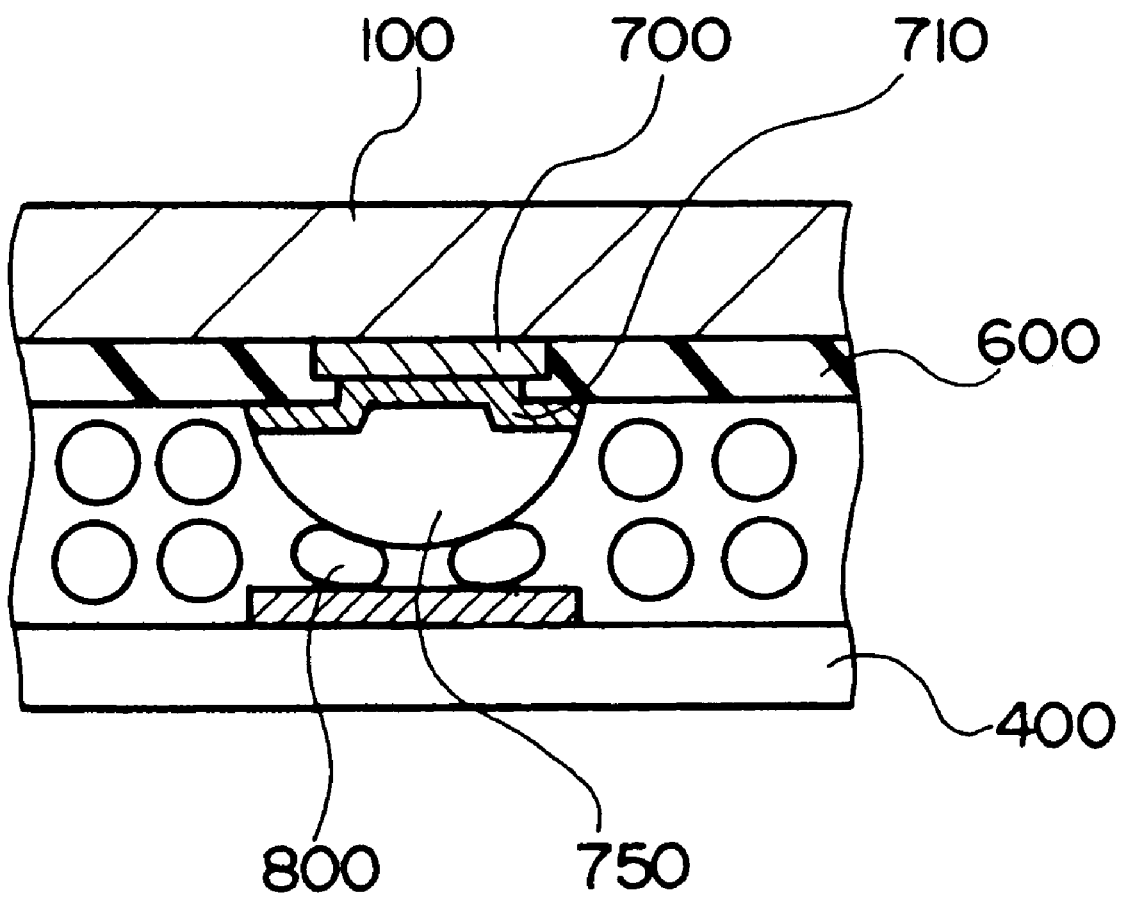
FIG. 3 shows an example of bonding, combining a conductive projection (bump) and an anisotropic conducting film.

Any combination of the above constructions may be used. FIG. 3 is a combination of the method using bumps of FIG. 2A, and the method using an anisotropic conducting film of FIG. 2C. In FIG. 3, reference numeral 750 indicates a bump electrode.

In the present embodiment, the operation of mounting a sealed assembly or IC on a printed wiring board is easy. The cost can also be reduced without any wasted space.

In the embodiment of FIG. 1, to the extent that the opening portion 340 is formed in the printed wiring board 400, the rigidity of the printed wiring board 400 itself is reduced. However, since the sealed assembly is connected to the printed wiring board (particularly in the vicinity of the opening thereof), the presence of the sealed assembly means that there is no actual reduction in rigidity of the printed wiring board 400, and in some circumstances the rigidity may be improved compared with the case in which the opening portion is not provided. As a result, the reliability of the device itself can be maintained.

Second Embodiment

Figure 4:
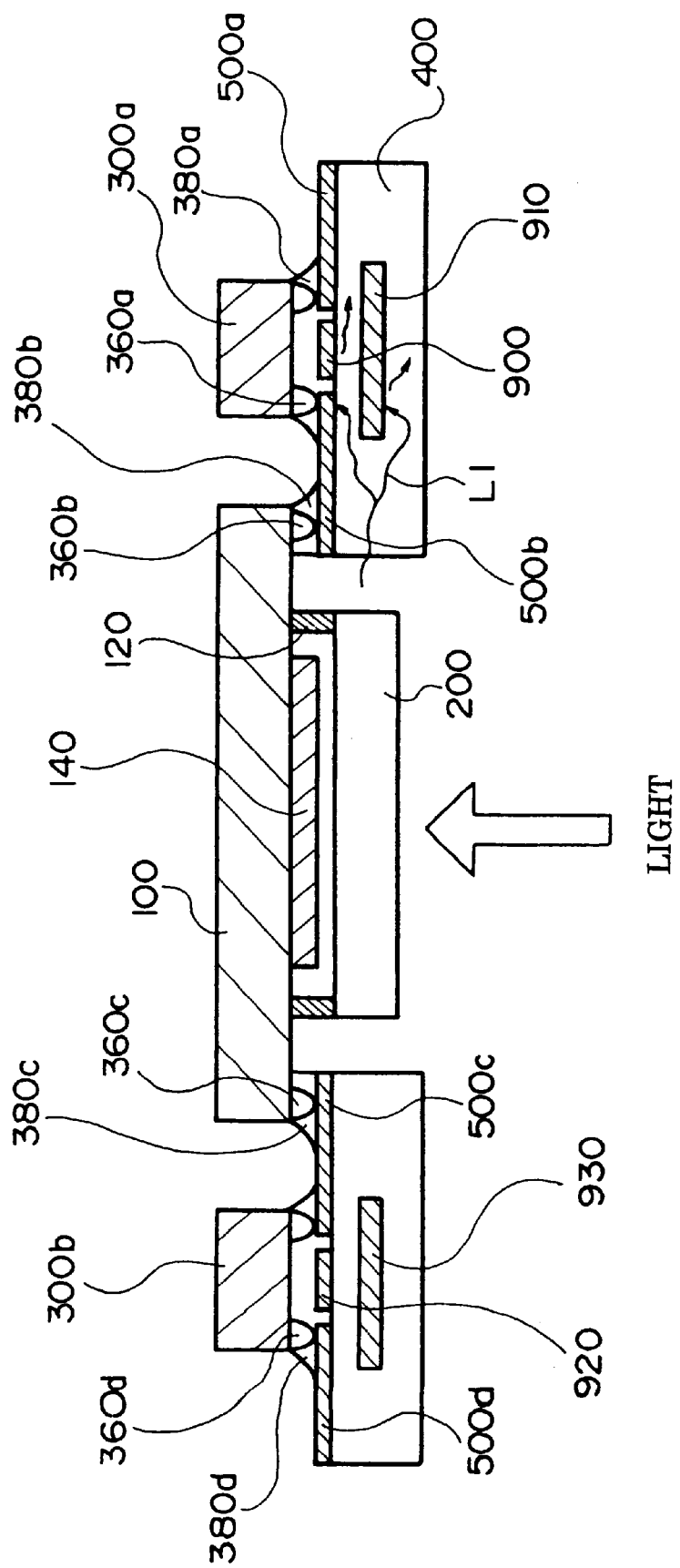
FIG. 4 shows a second embodiment of the present invention.

FIG. 4 shows a second embodiment of the present invention. The characteristic of the present embodiment is that as a countermeasure against stray light, an IC (semiconductor integrated circuit device) mounted on a printed wiring board is provided with an opaque layer on the underside of the IC.

In other words, the printed wiring board 400 is provided with opaque layers 900 and 920 on the surface positioned below ICs 300a and 300b. The printed wiring board 400 is also provided internally with embedded opaque layers 910 and 930. It should be noted that the internally provided opaque layers are larger in extent than the mounted ICs 300a and 300b, and it is preferable from the viewpoint of shutting out light that they are completely overlapping are provided so that the ICs are included within the opaque layers. Alternatively, it may also be effective to provide a number of opaque layers of relatively small extent. In this case, it is preferable for the opaque layers to form particularly a multilayer construction. In more detail, by means of a plurality of opaque layers forming a multilayer construction, it is preferable that the opaque layers are disposed so as at least partially to overlap by being offset in the planar direction in order to form a large region for shutting out light.

On the other hand, when an adequate opaque layer cannot be achieved because of restrictions of design or the like, for example in the case that the mounting surface area of the IC cannot be completely covered, by providing the opaque layer only in positions where particularly tends to malfunction with respect to light (a voltage transducer circuit portion or the like), the minimum requisite light blocking effect can be obtained.

The opaque layers 900 to 930 are formed of the same material as the wiring layers 500a, 500b, 500c, and 500d on the printed wiring board 400 (for example, copper or an alloy thereof), and are previously formed in the process of fabricating the printed wiring board 400. It should be noted that when forming an opaque layer on a ceramic substrate, as the material of the opaque layer may be used gold, silver, silver palladium, copper, pigment or tungsten or the like.

The opaque layers 910 and 930 embedded within the printed wiring board 400 can easily be formed by the fabrication technology of multilayer printed circuit boards.

The opaque layers 900 to 930 can be used simultaneously as ground wires, power supply wires, or the like. In this way, the power supply wire or ground wire can also function as an opaque layer, and moreover be effective as a shield to electromagnetic noise and the like.

A pattern of a conductive material such as copper is opaque, and does not allow light to pass. Therefore stray light L1 shown by the arrows in FIG. 4 is reflected or absorbed by the opaque layers 900 to 930, and as a result light does not reach the ICs 300a and 300b. Impinging light is a cause of electron-hole pairs within the semiconductor substrate, leading to IC noise. For this reason, shutting out the light can allow IC malfunction to be prevented.

The position of the opaque layer to be formed must be at least the underside of the ICs 300a and 300b, and such as to provide an overlap with the bottom of the ICs.

In the present embodiment, not only the surface of the printed wiring board 400, but also the interior thereof has formed the opaque layers 910 and 930. Since the opaque layers 900 and 920 formed on the surface of the printed wiring board 400 cannot be provided in the bonding region of the ICs 300a and 300b, it is difficult to completely shut out stray light, in the vicinity of the conductive projections (bumps) 360a and 360d (the bonding region). However, the opaque layers 910 and 930 provided inside of the printed wiring board 400 can be disposed over the whole area, without concerning for the bonding region, and therefore it is possible to definitely shut out light.

However, it is not necessarily essential to provide all of the opaque layers 900 to 930, and according to circumstances, only the opaque layers on the printed circuit board, or only the opaque layers inside the printed wiring board may be formed.

For further improvement of the light shutting out property, an opaque layer may further be provided on the surface of the printed wiring board 400 opposite to that on which the ICs are mounted (in other words the reverse surface of the printed wiring board). This opaque layer can be formed of the same material as the opaque layers 900, 910, 920, and 930 shown in FIG. 4, that is to say, the wiring material of the printed wiring board. By providing the opaque layer on the surface layer (outermost layer) of the reverse surface of the mounting substrate, the opaque layer can be provided afterwards (post-provided). In other words, the conventional substrate fabrication process can be used without alteration, and a step of providing the opaque layer simply added. Therefore, a selection not to provide an opaque layer can be carried out easily, and the range of selection is broadened. Further, since the surface on which the opaque layer is provided is the surface opposing the surface on which the ICs are mounted, with no need to consider the bonding position of the wires or IC, the opaque layer may simply be provided over the whole of a desired region, and can be provided easily.

In case this construction is adopted, a double-sided substrate is used. In other words, a multilayer substrate does not have to be used, which is favorable from the point of view of cost.

It should be noted that the sealed assembly having an optical conversion function used in the present embodiment is the same as in FIG. 1.

Third Embodiment

Figure 5A:
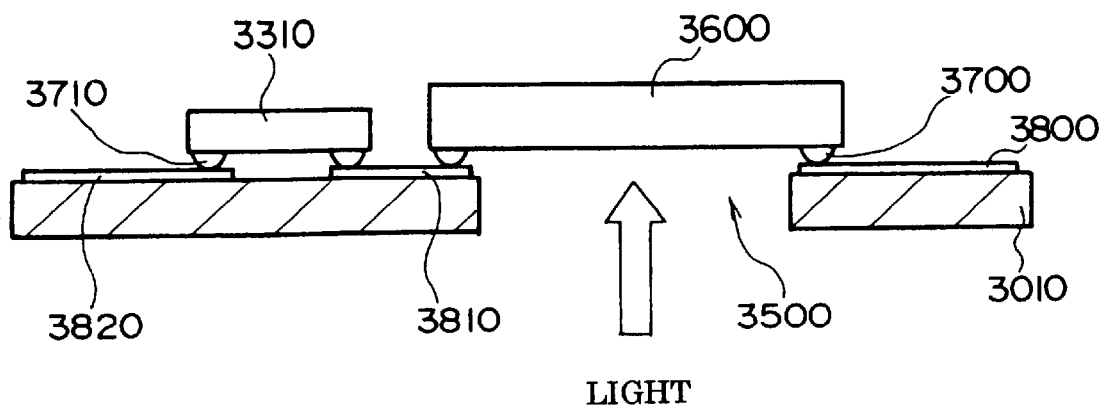
FIGS. 5A and 5B show a third embodiment of the present invention.
Figure 5B:
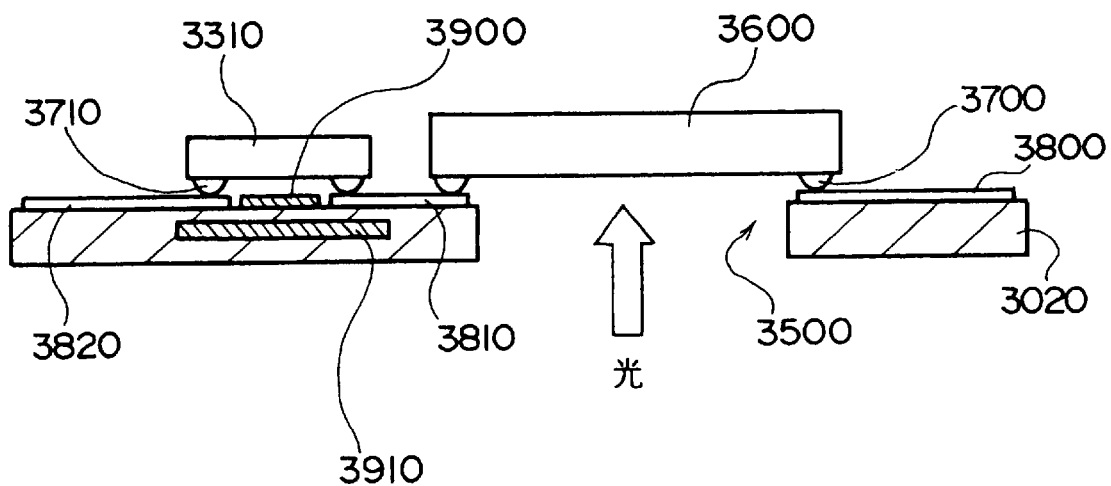

FIGS. 5A and 5B show a third embodiment of the present invention.

The characteristic of the embodiment shown in FIG. 5A is that "an optical modulation element such as a CCD is face-down bonded to a mounting substrate having a light shutting out property and an opening portion, and the active surface of the optical modulation element is exposed to light through the opening portion."

In FIG. 5A, in a printed wiring board 3010 is provided an opening portion 3500, and an optical modulation element 3600 such as a CCD is face-down bonded using bumps 3700. The IC chip 3310 is also face-down bonded using bumps 3710. It should be noted that reference numerals 3800, 3810, and 3820 indicate wiring layers.

Figure 14:
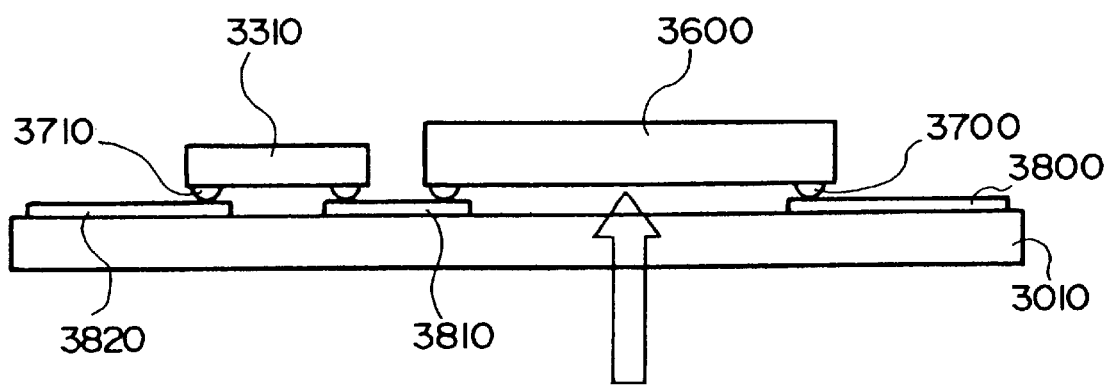
FIG. 14 shows an example of an optical transducer (example of a light modulating element such as a CCD mounted on a glass substrate).

As described above, in a mounting method using a transparent glass substrate as in FIG. 14, it is difficult to build up conducting layers, and there are limits to high density mounting. To this end, in the present embodiment, an optical modulation element is mounted on a "mounting substrate such as a printed wiring board" allowing a layered construction of the conducting layers to be adopted. By this means, a layered construction of the conducting layers can be adopted, and as a result, in particular, a build-up formation of the IC input/output wires can be used, and therefore the distance between the IC and the extremity of the substrate can be reduced. Therefore, high density mounting becomes possible, and a stupendous effect in device miniaturization is obtained.

However, since a printed wiring board, ceramic substrate, or the like is opaque, if an optical modulation element is mounted by face-down bonding on a normal mounting substrate (one to which no special measures have been applied), it is not possible for light to reach the active surface of the optical modulation element, nor for light to be conducted away from the active surface. Here, the opening portion 3500 is provided in a particular location of the mounting substrate to make it possible for light to reach the active surface of the optical modulation element, and for light to be conducted away from the active surface, through the opening portion 3500.

In FIG. 5B, opaque layers 3900 and 3910 are further provided. Since it is possible for light to reach the IC 3310 from the reverse surface of the printing wiring board, in the present embodiment the opaque layers 3900 and 3910 are provided, to protect the IC from light. By this means, malfunction of the IC can be prevented. It should be noted that it is sufficient to provide at least only either of the opaque layers 3900 and 3910.

Fourth Embodiment

Figure 6:
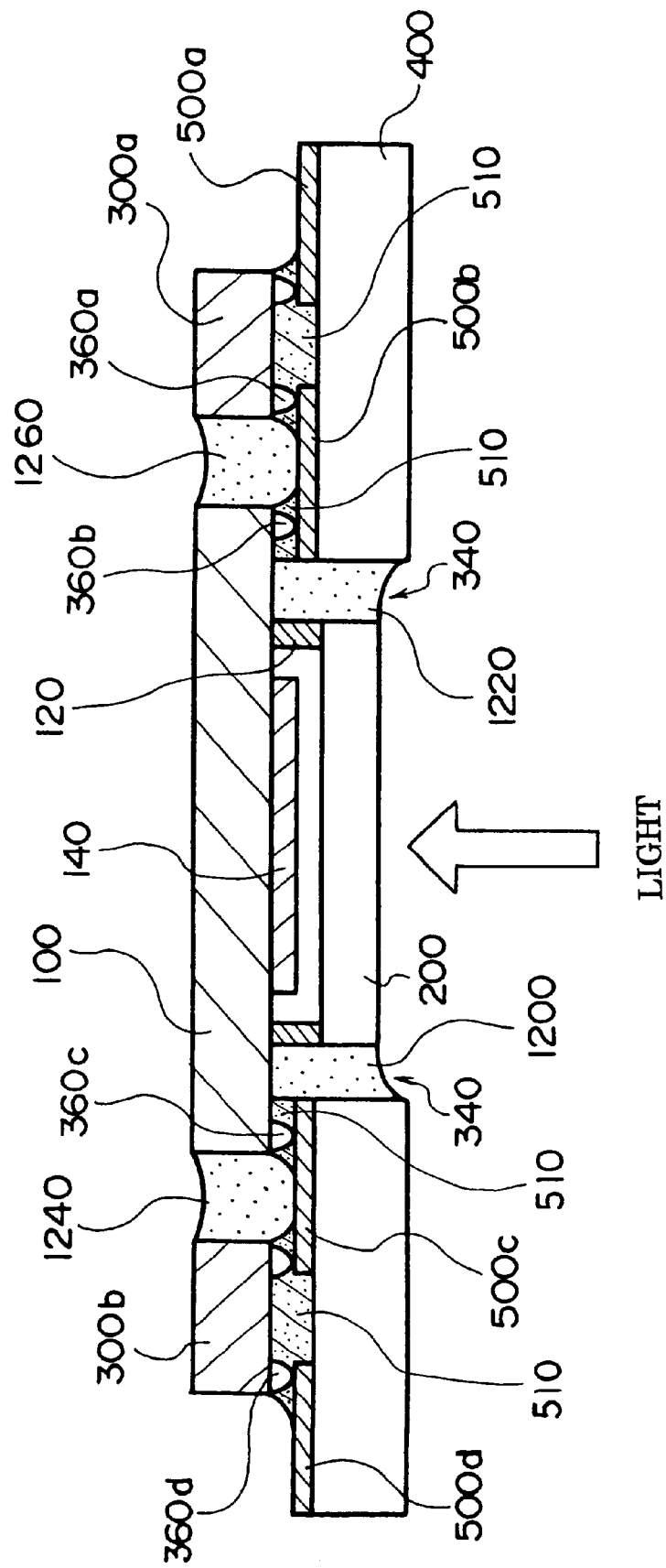
FIG. 6 shows a fourth embodiment of the present invention.

FIG. 6 shows a fourth embodiment of the present invention.

The characteristic of the present embodiment is that particular locations of the optical transducer shown in FIG. 1 are filled with resin so that the property of shutting out light is improved.

In FIG. 6, resin layers 1200 and 1220 are provided to prevent light from escaping through the gaps on the periphery of the opening portion 340 provided in the printed wiring board 400.

During filling with the resin, the sealing member 200 and inner wall of the opening portion of the printed wiring board serve as a dam to prevent spreading of the resin, and therefore adjustment of the amount of resin inserted and positioning during filling is easy.

It should be noted that preferably the resin layers 1200 and 1220 are inserted so that there are no gaps within the opening portion 340.

Resin layers 1240 and 1260 are provided to fill the gap between the base member 100 and ICs 300*a* and 300*b*, to shut out light leaking as far the mounting surface of the printed wiring board 400.

During filling with the resin, the base member 100 and side surfaces of the ICs 300*a* and 300*b* serve as a dam to prevent spreading of the resin, and therefore adjustment of the amount of resin inserted and positioning during filling is easy. It should be noted that if the base member 100 and ICs 300*a* and 300*b* are separated, resin may be provided separately at the respective extremities thereof.

By means of the filling with resin, no light reaches the ICs 300*a* and 300*b*, and the optical transducer reliability is improved. It should be noted that it is not necessarily essential for all of the resin layers 1200, 1220, 1240, and 1260 to be provided, and for example, resin layers 1200 and 1220 only may be provided.

In the present embodiment, the projections (bumps) 360*a* to 360*d* are electrically connected to the wires 500*a* to 500*d* using an anisotropic conducting film 510. However, if the anisotropic conducting film 510 is not used a space is formed in this region. In this space, the resin which constitutes the resin layers 1240 and 1260 is injected to form a protective layer.

Further, in the present embodiment, the mounting surface of the printed circuit board on which the ICs 300*a* and 300*b* are mounted is on the opposite side from the surface on which light impinges, and it is only necessary to block light leaking in through the opening portion 340 of the printed wiring board, and therefore the light blocking property is good.

It should be noted that it is preferable that the resin used for filling has a color which has a function to absorb light, particularly black resin. From a consideration of the material qualities, a silicone or epoxy resin may be used.

Resin may be provided on the upper surface of the ICs 300*a* and 300*b* (that is, the surface opposite to the junction surface), over the whole area or a part thereof, and further may be provided on the side surfaces of the ICs 300*a* and 300*b* over the whole area or a part thereof. By this means, the light shutting out property is further improved, and the resistance of the ICs to damp is also improved.

Resin may be applied to the whole area of the surface opposing the element mounting surface of the printed wiring board 400 (the substrate surface on the side on which the light impinges).

An opaque layer may be applied to whole area of the surface opposing the element mounting surface of the printed wiring board 400 (the surface on the side on which the light impinges). Such a construction can be effectively used not only for a printed wiring board, but also for a glass substrate. In particular, when an IC is mounted on a transparent substrate such as a glass substrate, malfunction of the IC can be prevented, and this is beneficial. It should be noted that the opaque layer provided on the reverse surface of the substrate is not necessarily required to be provided over the whole area, and may be provided only where necessary. The opaque layer on the reverse surface of the substrate may be formed, for example, by applying resin to the substrate, then hardening the resin.

Fifth Embodiment

Figure 7:
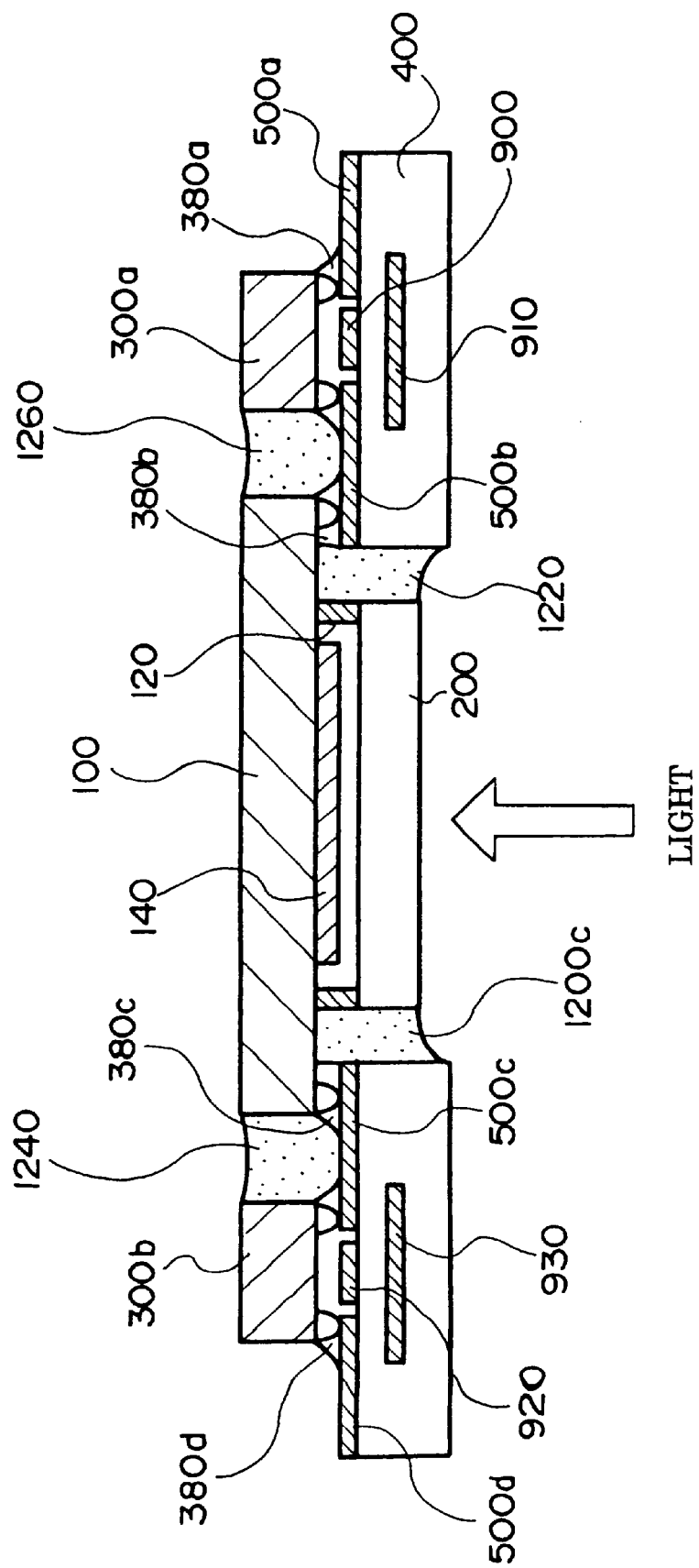
FIG. 7 shows a fifth embodiment of the present invention.

FIG. 7 shows a fifth embodiment of the present invention. The characteristic of the present embodiment is that the optical transducer of FIG. 6 (filled with resin) is further provided with the opaque layers shown in FIG. 4.

As shown in FIG. 7, the underside of ICs 300a and 300b is provided with opaque layers 900, 910, 920, and 930 of the same material as the wires of the printed wiring board. By this means, the property of shutting out light of the ICs 300a and 300b is increased, and the reliability is further improved.

To further improve the light blocking property, an opaque layer may be provided on the opposite surface to the IC mounting surface of the printed wiring board 400 (that is, the reverse surface of the printed wiring board). This opaque layer can be constructed of the same material as the opaque layers 900, 910, 920, and 930 shown in FIG. 7, that is to say, the material of the wires of the printed wiring board.

Sixth Embodiment

Figure 8:
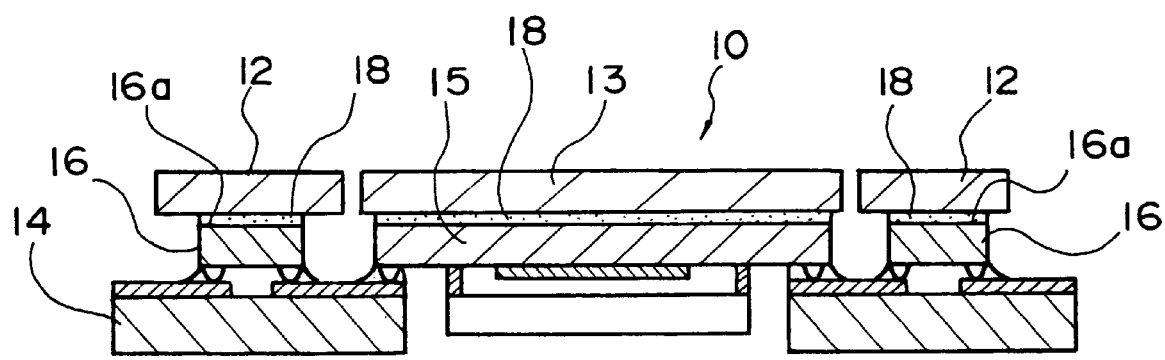
FIG. 8 shows a sixth embodiment of the present invention.

FIG. 8 shows a sixth embodiment of the present invention. An optical transducer 10 shown in this figure has the optical transducer shown in FIG. 1, to which heat radiating plates 12 and 13 are attached. In more detail, in this figure, on the upper surface of an IC 16 provided on a printed wiring board 14, that is to say, on the surface 16a opposite to the mounting surface, a heat radiating plate 12 is attached by means of thermally conductive adhesive 18. To a sealed assembly 15 a heat radiating plate 13 is attached by means of thermally conductive adhesive 18.

According to the present embodiment, by means of the heat radiating plates 12 and 13, the IC 16 and sealed assembly 15 can be cooled. In particular, since the adhesive 18 is thermally conductive, heat from the IC 16 and sealed assembly 15 is easily conducted to the heat radiating plates 12 and 13, and the heat releasing effect is good.

Further, by means of the heat radiating plate 12, at least a part of the IC 16 is covered, and can be shielded from light. By this means, malfunction of the IC 16 can be prevented.

As for the remainder of the construction, description is omitted since it is the same as that of the optical transducer shown in FIG. 1. It should be noted that in the present embodiment, in place of the sealed assembly, an optical modulation element can be mounted to achieve cooling the optical modulation element.

Seventh Embodiment

Figure 9:
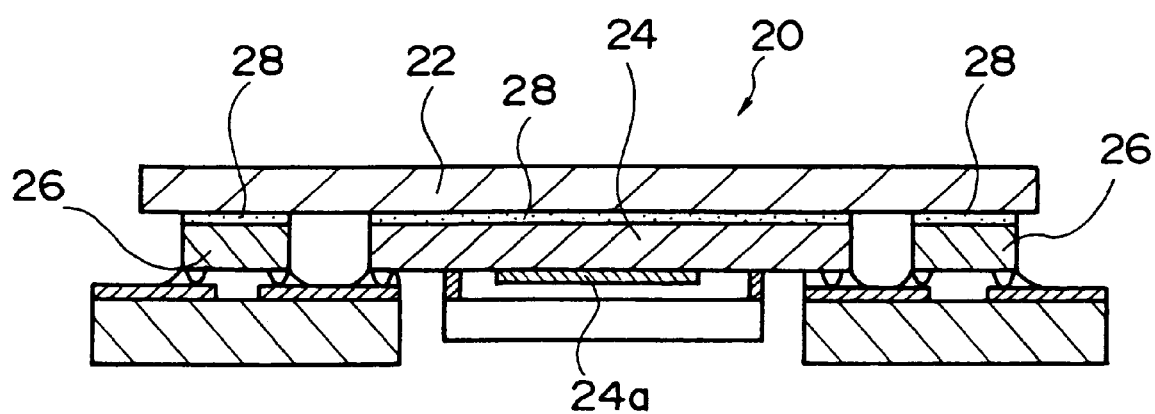
FIG. 9 shows a seventh embodiment of the present invention.

FIG. 9 shows a seventh embodiment of the present invention. An optical transducer 20 shown in this figure has the optical transducer shown in FIG. 1, to which a heat radiating plate 22 is attached. This heat radiating plate 22 differs from the heat radiating plate 12 shown in FIG. 8 is being attached not only to the ICs 26, but also to the sealed assembly 24. It should be noted that the sealed assembly 24 is formed by sealing the element 24a which has an optical processing function. In more detail, this is the same as shown in FIG. 1.

This heat radiating plate 22 also is attached by a thermally conducting adhesive 28. According to the present embodiment, not only the ICs 26 but also the sealed assembly 24 is cooled. Moreover, since the heat radiating plate 22 has a large area, not only can the cooling effect be further improved, but also the property of shutting out light is increased, and malfunction of the ICs 26 can be even more so prevented.

It should be noted that in the present embodiment, in place of the sealed assembly, an optical modulation element may be mounted to achieve cooling the optical modulation element.

Eighth Embodiment

Figure 10:
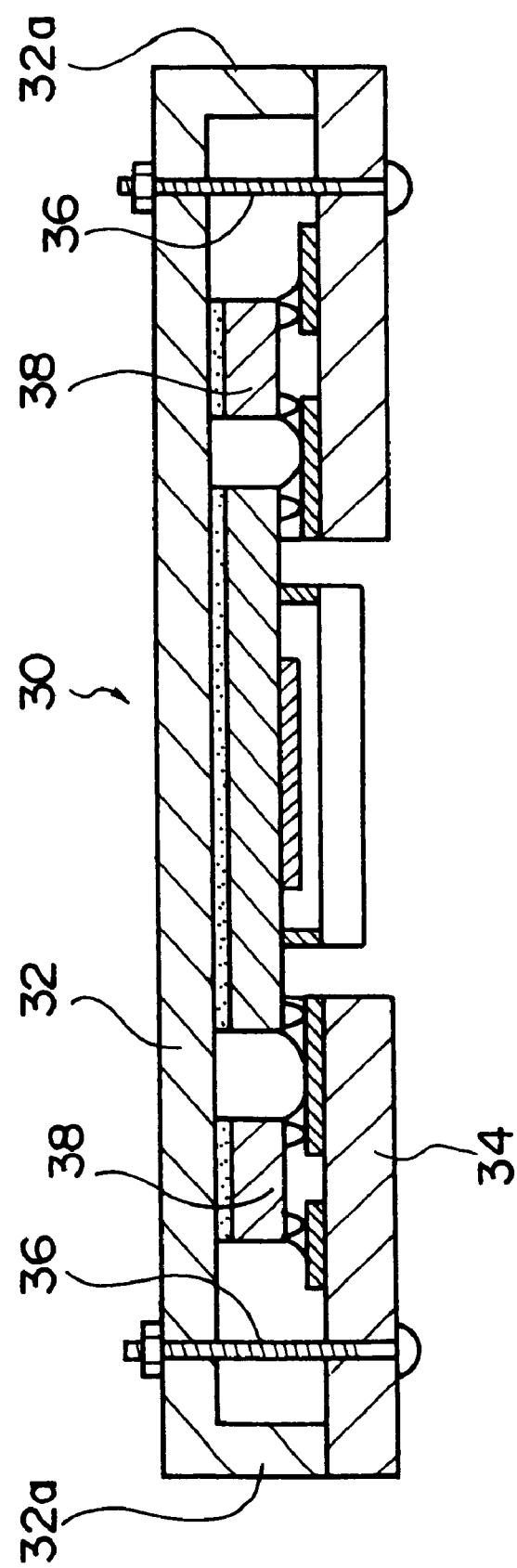
FIG. 10 shows an eighth embodiment of the present invention.

FIG. 10 shows an eighth embodiment of the present invention. An optical transducer 40 shown in this figure has the optical transducer shown in FIG. 1, to which a heat radiating plate 32 is attached. This heat radiating plate 32 differs from the heat radiating plate 22 shown in FIG. 9 in being fixed to a printed wiring board 34.

More specifically, the extremities of the heat radiating plate 32 have support portions 32a formed on a surface opposing the printed wiring board 34. With the support of the support portions 32a, the heat radiating plate 32 and printed wiring board 34 are fixed together by means of screws 36 passing through the heat radiating plate 32 and printed wiring board 34. Other configuration is the same as that of the optical transducer 20 shown in FIG. 9.

According to the present embodiment, since the heat radiating plate 32 and printed wiring board 34 are formed as one unit, the mechanical strength is improved, and the reliability upon strength is increased. The heat radiating plate 32, as shown in FIG. 10, has substantially the same size as the printed wiring board 34, and therefore the heat releasing area is increased, and the heat releasing efficiency is also improved. Therefore, even without forming fins or the like, a sufficient heat releasing function is provided. Further, since the ICs 38 are covered by the heat radiating plate 32 and support portions 32a, a malfunction of the ICs 38 due to light can be prevented.

It should be noted that in the present embodiment, in place of the sealed assembly, an optical modulation element may be mounted to achieve cooling the optical modulation element.

Ninth Embodiment

Figure 11:
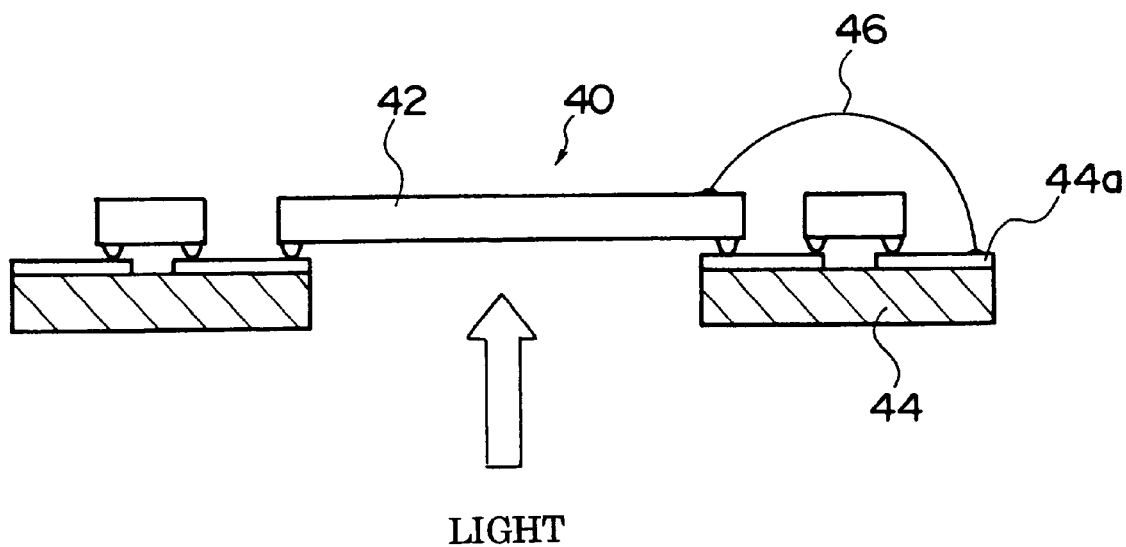
FIG. 11 shows a ninth embodiment of the present invention.

FIG. 11 shows a ninth embodiment of the present invention. An optical transducer 40 shown in this figure is the same as the optical transducer shown in FIG. 5A, except in that an optical modulation element 42 and wire 44a of a printed wiring board 44 are connected by a wire 46.

By means of this, since the optical modulation element 42 and wire 44a are electrically conducting, charged electrical potential on the optical modulation element 42 can escape to the wire 44a. There, it is preferable for the wire 44a to be at ground potential. Alternatively, when the wire 44a is at a certain potential, the potential of the connection portion of the optical modulation element 42 can be set to the certain potential.

It should be noted that in the present embodiment, in place of the optical modulation element 42, a sealed assembly may be mounted. In this case, a base member of the sealed may to be formed of a conductive material, an element having an optical processing function and the base member may be electrically connected, and the base member and wire may be connected by a wire.

Tenth Embodiment

Figure 12:
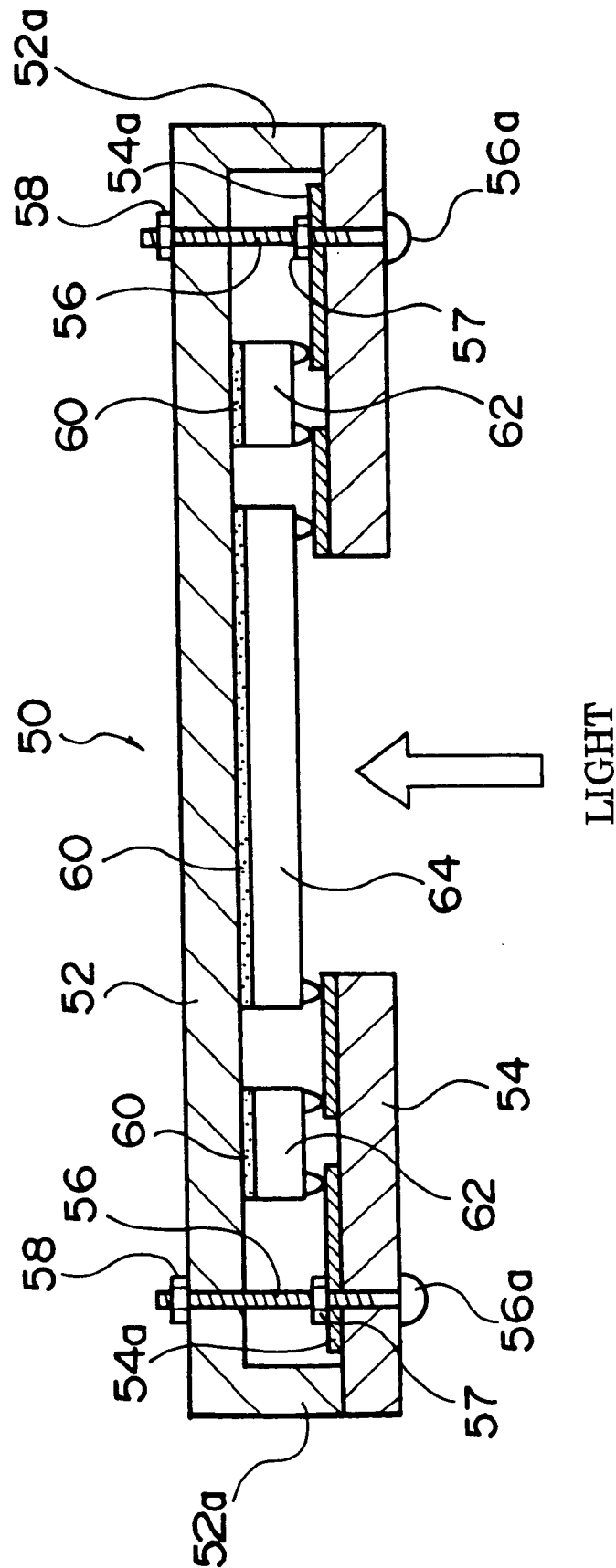
FIG. 12 shows a tenth embodiment of the present invention.
Figure 13:
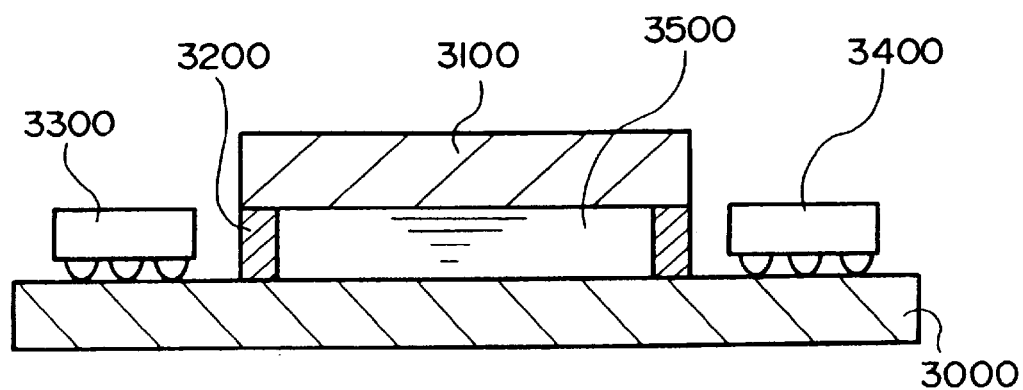
FIG. 13 shows an example of an optical transducer (liquid crystal display device)

FIG. 12 shows a tenth embodiment of the present invention. An optical transducer 50 shown in this figure has the optical transducer shown in FIG. 5A, to which a heat radiating plate 52 is attached. This heat radiating plate 52 has excellent heat releasing properties and is electrically conducting, and is fixed to a printed wiring board 54.

In more detail, the heat radiating plate 52 is attached to ICs 62 and an optical modulation element 64 through an adhesive 60 which is thermally conductive and electrically conductive. Since the adhesive 60 is thermally conductive, heat from the ICs 62 is conveyed to the heat radiating plate 52, thus achieving cooling.

At the extremities of the heat radiating plate 52, on the surface opposing the printed wiring board 54 are formed support portions 52a. With the support of these support portions 52a, the heat radiating plate 52 and printed wiring board 54 are fixed together, by means of screws 56 passing through the heat radiating plate 52 and printed wiring board 54, and nuts 58 engaging to the screw 56.

Further, the screws 56 also pass through wires 54a formed on the printed wiring board 54. Then by means of the heads 56a of the screws 56 and nuts 57, the printed wiring board 54 and wires 54a are clamped, and the screws 56 and wires 54a are electrically connected. For this purpose it is a prerequisite that the screws 56 are conductive.

By means of this, the optical modulation element 64 and the wires 54a can be electrically connected. In other words, the optical modulation element 64 and conductive heat radiating plate 52 are electrically connected through the conductive adhesive 60, and the heat radiating plate 52 and wires 54a are electrically connected through the conductive screws 56.

By means of this construction, charged electric potential on the optical modulation element 64 can escape to the wires 54a. Therefore, it is preferable for the wires 54a to be at ground potential. Alternatively, when the wires 54a are at a certain potential, the potential of the connection portion of the optical modulation element 64 can be set to the particular voltage.

According to the present embodiment, by means of the screws 56 and nuts 58, the heat radiating plate 52 and printed wiring board 54 are formed as one unit, the mechanical strength is improved, and the reliability upon strength is increased. The heat radiating plate 52, as shown in FIG. 12, has substantially the same size as the printed wiring board 54, therefore, the heat releasing area is increased, and the heat releasing efficiency is also improved. Therefore, even without forming fins or the like, a sufficient heat releasing function is provided. Further, since the ICs 62 are covered by the heat radiating plate 52 and support portions 52a, a malfunction of the ICs 62 due to light can be prevented.

It should be noted that in the present embodiment, in place of the optical modulation element 64, a sealed assembly may be mounted. In this case, a base member of the sealed assembly may be formed of a conductive material, and an element having an optical processing function and the base member may be electrically conducting, and the base member and wire may be connected.

The present invention can be widely applied as a mounting technology for display devices using light receiving elements such as photodiodes, light emitting elements such as semiconductor lasers, or light modulating elements such as liquid crystals or reflecting mirror devices.

What is claimed is:

1. A method of mounting a sealed assembly, being of projecting form and having a sealing member fixed to a portion of a base member in such a way as to project from said base member, on a mounting substrate, comprising:

a step of providing an opening portion in a portion of said mounting substrate, and providing a conductive junction portion on a surface of said base member outside of said sealing member; and with at least a part of said sealing member positioned within said opening portion of said mounting substrate, a step of connecting said conductive junction portion to a wire on said mounting substrate.

2. The method of mounting a sealed assembly of claim 1, wherein at least a portion of said sealing member is formed of a material allowing light to pass.

3. The method of mounting a sealed assembly of claim 1, wherein an IC used with respect to said sealed assembly is mounted on said mounting substrate by direct connection of a conductive junction portion to said wire of said mounting substrate.

4. The method of mounting a sealed assembly of claim 3, wherein said IC is mounted simultaneously with said sealed assembly.

5. The method of mounting a sealed assembly of claim 4, wherein said IC is mounted on said mounting substrate by the same connection method as said sealed assembly.

6. An optical transducer comprising:

an optical modulation component having an optical conversion function; and a mounting substrate on which said optical modulation component is mounted, said mounting substrate having an opening portion, wherein said optical modulation component is a sealed assembly, said sealed assembly has a sealing construction, and at least a part of said sealing construction is positioned within said opening portion of said mounting substrate.

7. The optical transducer of claim 6, wherein:

said sealing construction includes a sealing member being fixed to a portion of a base member, a conductive junction portion is provided on a surface of said base member outside of said sealing member and said conductive junction portion is connected to a wire on said mounting substrate.

8. The optical transducer of claim 6, wherein a gap between said optical modulation component and an inner wall of said opening portion of said mounting substrate is filled with resin.

9. The optical transducer of claim 6, wherein on a surface of said mounting substrate where said optical modulation component is mounted, an IC used with respect to said optical modulation component is connected through a conductive junction portion.

10. The optical transducer of claim 9, wherein on a surface of said mounting substrate below said IC, an opaque layer is provided.

11. The optical transducer of claim 10, wherein said opaque layer is of the same material as a layer of said wire on said mounting substrate.

12. The optical transducer of claim 9, wherein on a surface of said mounting substrate opposite to a surface on which said IC is mounted is formed an opaque layer overlapping with at least a portion of said IC.

13. The optical transducer of claim 9, wherein inside of said mounting substrate below said IC, an opaque layer is provided.

14. An optical transducer comprising:

an optical modulation component having an optical conversion function, said optical modulation component mounted with an active surface facing a mounting surface of said mounting substrate; and a mounting substrate on which said optical modulation component is mounted, said mounting substrate having an opening portion in an area facing a whole active region performing optical conversion of said active surface of said optical modulation component, wherein, on a surface of said mounting substrate where said optical modulation component is mounted, an IC used with respect to said optical modulation component is connected through a conductive junction portion, inside of said mounting substrate below said IC, an opaque layer is provided, and said opaque layer is of the same material as a layer of said wire of said mounting substrate.

15. The optical transducer of claim 9, wherein a heat radiating plate is adhered to a surface of said IC opposite to a surface on which said junction portion is formed.

16. The optical transducer of claim 9, wherein a heat radiating plate is adhered to said optical modulation component.

17. The optical transducer of claim 9, wherein a heat radiating plate is adhered to a surface of said IC opposite to a surface on which said junction portion is formed and to said optical modulation component.

18. An optical transducer comprising:

an optical modulation component having an optical conversion function, said optical modulation component mounted with an active surface facing a mounting surface of said mounting substrate; and a mounting substrate on which said optical modulation component is mounted, said mounting substrate having an opening portion in an area facing a whole active region performing optical conversion of said active surface of said optical modulation component, wherein, on a surface of said mounting substrate where said optical modulation component is mounted, an IC used with respect to said optical modulation component is connected through a conductive junction, a heat radiating plate is adhered to a surface of said IC opposite to a surface on which said junction portion is formed and to said optical modulation component, and said heat radiating plate is fixed to said mounting substrate.

19. The optical transducer of claim 6, wherein a surface of said optical modulation component other than a mounting surface for said mounting substrate, and a wire on said mounting substrate are electrically connected.

20. An optical transducer comprising:

an optical modulation component having an optical conversion function, said optical modulation component mounted with an active surface facing a mounting surface of said mounting substrate; and a mounting substrate on which said optical modulation component is mounted, said mounting substrate having an opening portion in an area facing a whole active region performing optical conversion of said active surface of said optical modulation component, wherein, on a surface of said mounting substrate where said optical modulation component is mounted, an IC used with respect to said optical modulation component is connected through a conductive junction, a heat radiating plate is adhered to a surface of said IC opposite to a surface on which said junction portion is formed and to said optical modulation component, and said heat radiating plate is adhered so as to be electrically conducting to a surface of said optical modulation component opposite to a mounting surface for said mounting substrate, and is electrically connected to a wire on said mounting substrate.

* * * * *